United States Patent [19]
Gaudet

[11] Patent Number: 6,094,082
[45] Date of Patent: Jul. 25, 2000

[54] DLL CALIBRATED SWITCHED CURRENT DELAY INTERPOLATOR

[75] Inventor: Brian Gaudet, San Jose, Calif.

[73] Assignee: National Semiconductor Corporation, Santa Clara, Calif.

[21] Appl. No.: 09/081,661

[22] Filed: May 18, 1998

[51] Int. Cl.[7] .................................................. H03H 11/26
[52] U.S. Cl. ......................... 327/270; 327/271; 327/276
[58] Field of Search ................................... 327/146–149, 327/152, 153, 155, 156, 158, 270, 271, 276, 277

[56] References Cited

U.S. PATENT DOCUMENTS

| | | | |
|---|---|---|---|
| 5,331,293 | 7/1994 | Shepherd et al. | 331/1 A |
| 5,418,822 | 5/1995 | Schlachter et al. | 375/354 |
| 5,485,490 | 1/1996 | Leung et al. | 375/371 |

*Primary Examiner*—Timothy P. Callahan
*Assistant Examiner*—An T. Luu
*Attorney, Agent, or Firm*—Limbach & Limbach L.L.P.

[57] ABSTRACT

A programmable phase adjuster spans a clock signal's period with N linearly distributed phase steps. The resulting phase adjust resolution is finer than that of an inverter delay for a given process. Enhancement of the phase resolution of a phase picker CRM architecture enables use of the architecture for recovering clock signals from high data rate data streams in a way that minimizes power and area and allows optimization for multi-channel applications.

1 Claim, 7 Drawing Sheets

| FIG. 6 |
|---|
| FIG. 6A |
| FIG. 6B |

DLL CALIBRATED SWITCHED CURRENT DELAY INTERPOLATOR

TECHNICAL FIELD

The present invention is directed to circuits for recovering a clock signal from a data stream and, more specifically, to a programmable phase adjuster that can be used to generate a set of evenly spaced phase steps that span the period of a recovered clock signal. Enhanced phase resolution can be used to more accurately recover the clock signal and data from the data stream.

BACKGROUND OF THE INVENTION

A common function of transmit and receive stations is to extract a clock signal from the data stream transmitted between the stations and to use the recovered clock signal to properly synchronize the operations performed on the incoming data, e.g., sampling and decoding of the data. In order to use the clock signal, it must be of the same frequency as and as close in phase as possible to the transmitted data stream.

A phase picker clock recovery architecture adjusts the phase of a recovered clock signal in response to a filtered phase error signal provided by a phase detector. The phase detector compares the phase of the recovered clock signal with the incoming data, generating an error signal representing the phase difference between the signals. The error signal is then used to drive an adaptive control loop which seeks to minimize the phase difference by selecting a different phase of N phases of a reference clock signal provided by a clock generation module (CGM) to be an updated clock signal. The N phases of the reference clock signal generated by the clock generation module are provided by tapping off of an N/2 stage differential voltage controlled oscillator (VCO). The selected phase of the reference clock signal is then used as the recovered clock signal and is compared to the data stream to update the error term. An N:1 phase multiplexer having the N phases of the reference signal as inputs is used to perform the actual phase selection.

The loop parameters of a phase picker clock recovery system are independent of PVT (process-voltage-temperature) and the CRM (clock recovery module) is completely digital.

A limitation of such architectures is that a phase picker CRM only works for narrow band clock recovery applications. In some situations, this is not a problem. For example, the ethernet 10 BT, 100 BX and 1000 BX standards are such that a narrow band CRM is adequate. However, the problem with extending a phase picker type CRM to recover clocks for higher frequency protocols, such as 100 mb and 1000 mb ethernet, is that the jitter tolerance is limited by the phase adjust resolution of the phase multiplexer. Simulations using a platform that has been correlated well to silicon show that a phase adjust resolution of 200 ps is required for 100 mb ethernet clock recovery, while a 30 ps phase adjust resolution is required for 1000 mb ethernet. A phase adjust step of 30 ps requires a differential VCO stage of delay under 30 ps at slow PVT. This is impossible to implement on current CMOS processes, where such a delay is on the order of 500 ps.

In the absence of using a phase picker architecture, there are several available methods for enhancing the resolution of a phase multiplexer in order to improve the clock recovery function of a circuit.

Coupled VCOs have been used to enhance the number of phase steps that can be obtained from a single VCO. For example, in "Precise-Delay Generation Using Coupled Oscillators", a dissertation by John Maneatis, Stanford University, June 1994, a method of coupling M N-stage ring oscillators is described. The method provides M*N phases of the VCO frequency with a phase difference between adjacent phases enhanced by a factor of M beyond that possible using a single N phase VCO.

Another method involves using an array of delay-locked-loops (DLL). This method is described by J. Christianson, CERN, Geneva, in a publication entitled "An Integrated High Resolution CMOS Timing Generator Based on an Array of Delay Locked Loops." The Christianson method uses M delay-locked-loops of N stages, the inputs for which come from consecutive stages of an M stage delay-locked-loop. This provides a delay resolution of a delay in the N-stage phase-locked-loop divided by M.

Another approach to enhancing phase resolution uses a mixer to interpolate between two CGM phases, doubling both the number of phases and the phase adjust resolution. This procedure can be repeated (doubling again), but simulations have shown that beyond two doublings, the precision of the enhanced phase resolution steps degrades.

An uncompensated interpolation method using inverters with switchable loads to produce an adjustable delay is described by M. Bazes et al. in "An Interpolating Clock Synthesizer", IEEE Journal of Solid-State Circuits, Vol. 31, No. 9, September 1996. This method uses inverters with N switchable loads to create the adjustable delay. The delay interpolator is calibrated by determining how many loads are required to be connected to span one gross phase step. Once this number is determined, the remaining loads are disabled. The number of points in the interpolation change depends upon PVT. For example, for fast PVT, it may take ten loads to span the gross phase step, while at slow PVT, it may take only three. This makes the actual delay step of the interpolator a function of PVT, which is acceptable for a CGM, but it is not acceptable for a CRM, where the phase step resolution is a critical parameter.

What is desired is an apparatus for increasing the phase resolution of the clock signals selected by a phase multiplexer which is part of a clock recovery circuit and which overcomes the limitations of existing devices.

SUMMARY OF THE INVENTION

The present invention is directed to a programmable phase adjuster that can be used to span a clock signal's period with N linearly distributed phase steps. The resulting phase adjust resolution is finer than that of an inverter delay for a given process.

An important application of the invention is to enhance the phase resolution of a phase picker CRM architecture. This enables using the architecture for recovering clock signals from high data rate data streams. The invention does this in a way that minimizes power and area and allows optimization for multi-channel applications such as ethernet switches and repeaters.

Further objects and advantages of the present invention will become apparent from the following detailed description and accompanying drawings which set forth an illustrative embodiment in which the principles of the invention are utilized.

DETAILED DESCRIPTION OF THE INVENTION

The present invention will now be described in the context of a phase picker type clock recovery module (CRM) architecture which uses a clock generation module (CGM) to provide six differential phases of a 250 Mhz clock signal. These phases are provided to a phase multiplexer and a delay-locked-loop (DLL) calibrated adjustable load delay interpolator that is used to break down the 667 ps (picosecond)-sized phase steps from the phase multiplexer into 83 ps-sized phase steps. This has the effect of breaking down each 667 ps phase step into eight 83 ps phase steps.

Phase Multiplexing and Delay Interpolation

Figure 1:
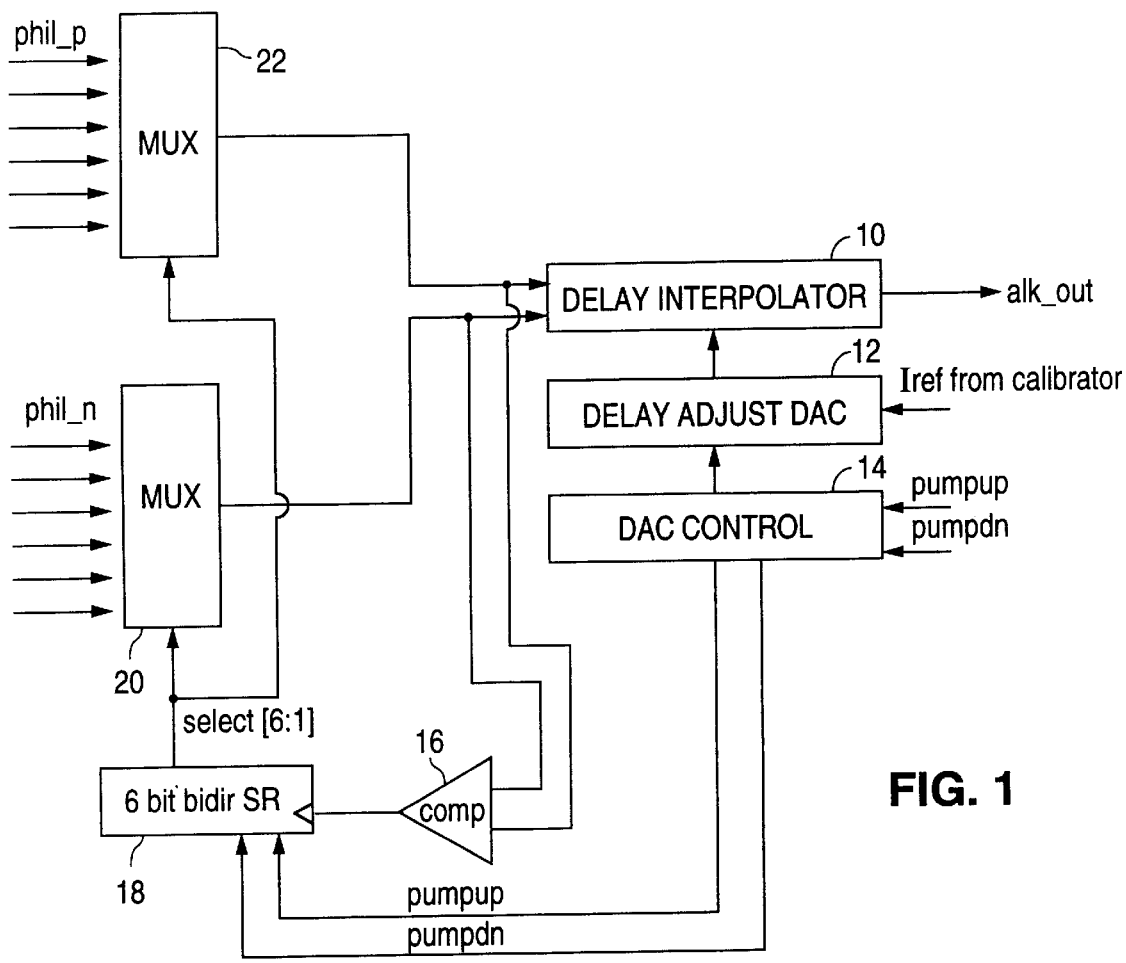
FIG. 1 is a block diagram illustrating a phase multiplexer connected to a delay (phase) interpolator in accordance with the present invention.

The delay interpolation circuit shown in FIG. 1 includes a delay interpolator 10, delay adjust digital-to-analog converter (DAC) 12, delay selector block 14, comparator 16, 6-bit bidirectional shift register 18 and two 6:1 passive multiplexers 20 and 22.

Delay interpolator 10 delays the clock signal provided by multiplexers 20 and 22 from some constant delay by an amount equal to +N*83.3 ps. The value of N is determined by the current provided by delay adjust DAC 12, which in turn is set by the delay selector block 14.

The operation of the FIG. 1 delay interpolation circuit will be described in the context of being used to enhance the phase adjust resolution of a phase picker phase-locked-loop (PLL). The digital loop filter of a phase picker PLL will output a pumpup and pumpdn pulse stream which is used to control the shift register 18 in the following manner.

Every pumpdown pulse causes the delay selector 14 to fill up with ones from the input. For example, if the delay selector contains 11110000, two pumpdown pulses will result in a value of 11111100. From here three pumpup pulses will result in a value of 11100000. In other words, the pumpup pulses cause the ones to drain from the input.

The value of delay selector 14 is used to turn on current sources in delay adjust DAC 12, which selects a delay from 83.3 ps+constant delay to 667 ps+constant delay in delay interpolator 10, the operation of which is described in greater detail below. Each "one" in the delay selector 14 adds another 83.3 ps delay to the total delay.

When delay selector 14 contains all ones and a pumpdown pulse is received, the delay selector 14 resets to 10000000 and a pumpdown pulse is sent to phase multiplexer phase selector 18. This causes the phase multiplexer to select a phase that is retarded 667 ps from the current phase. For example, if the current phase is phase 3, the phase multiplexer would select phase 4. Since delay selector 14 resets to 10000000 at the same time that the phase multiplexer retards the phase by 667 ps, the net result is retarding the phase by 83 ps. This is the same as if delay selector 14 received a pumpdown pulse when the value of delay selector 14 was 11110000 (or some value other than 11111111), causing the delay selector 14 to move to 11111000.

When delay selector 14 contains 10000000 and a pumpup pulse is received, the delay selector 14 resets to 11111111 and a pumpup pulse is sent to phase multiplexer selector 18. This causes the phase multiplexer to select a phase that is advanced 667 ps from the current phase. For example, if the current phase is phase 3, the phase multiplexer would select phase 2. Since delay selector 14 resets to 11111111 at same time that the phase multiplexer advances the phase by 667 ps, the net result is advancing the phase by 83 ps. This is the same as if delay selector 14 received a pumpup pulse when the value of delay selector 14 was 11110000 (or some value other than 10000000), causing the delay selector 14 to move to 11100000.

Figure 3:
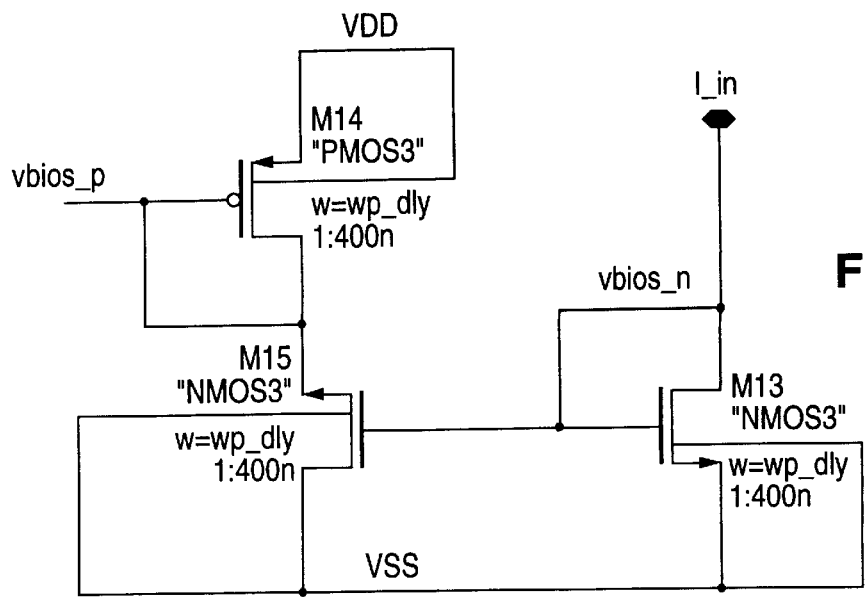
FIG. 3 is a schematic drawing illustrating an embodiment of a reference circuit utilizable in the FIG. 1 circuit.
Figure 2:
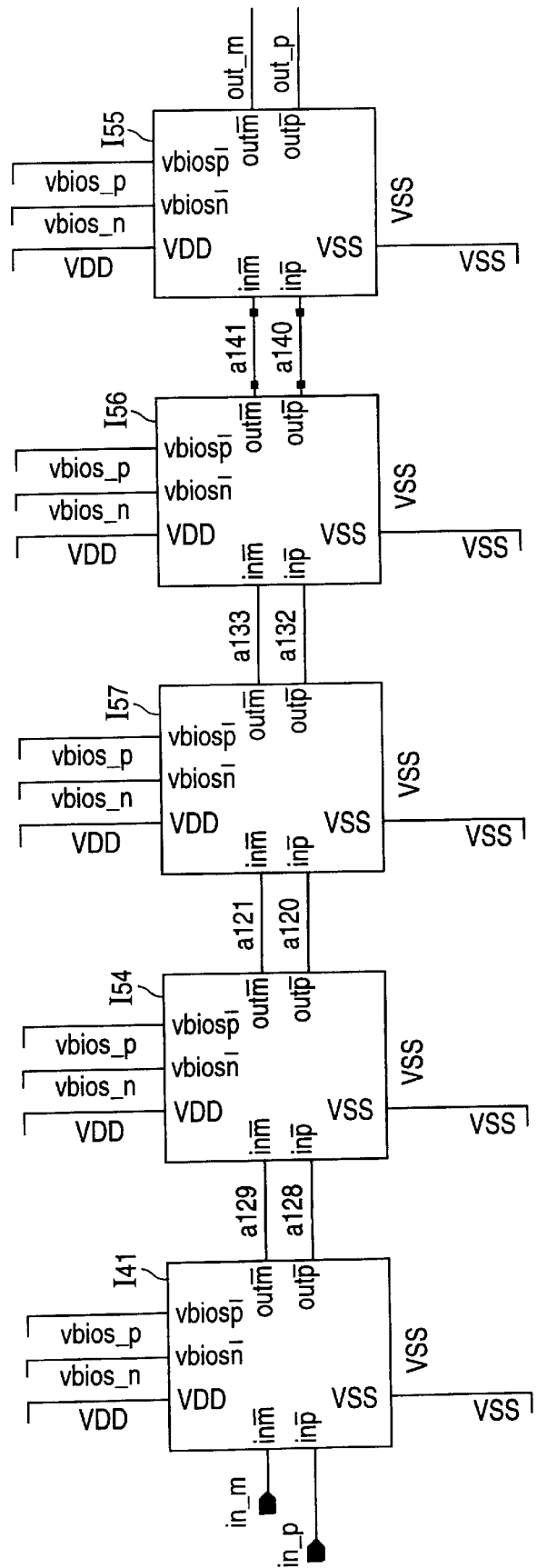
FIG. 2 is a schematic drawing illustrating an embodiment of a delay interpolator circuit utilizable in the FIG. 1 circuit.
Figure 4:
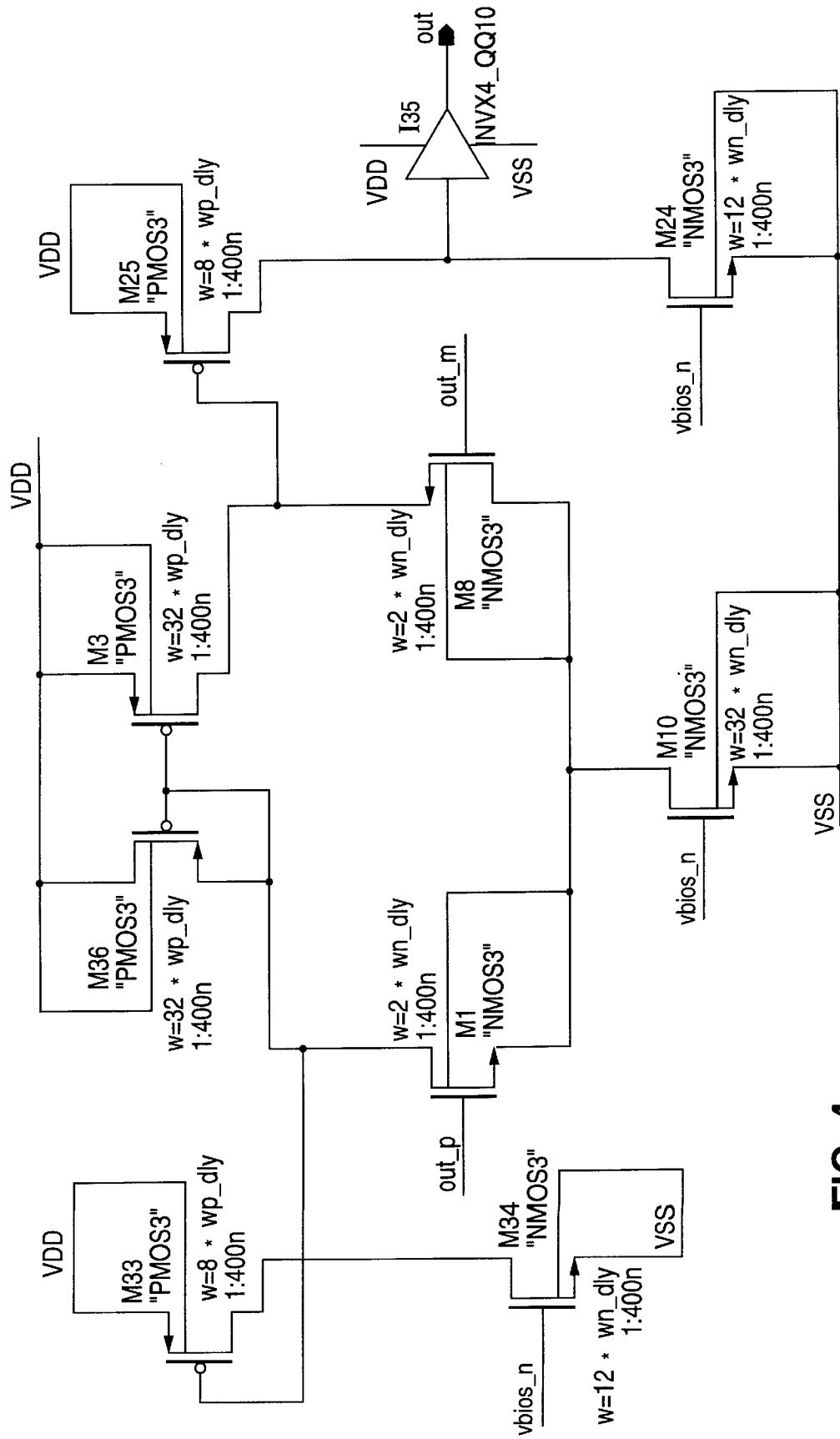
FIG. 4 is a schematic drawing illustrating an embodiment of a comparator circuit utilizable in the FIG. 1 circuit.

FIG. 2 shows an embodiment of a delay interpolator 10 that includes a chain of five open loop differential amplifiers 30. The inputs to the differential amplifier chain, in_p and in_m, are provided as the outputs of phase multiplexers 20 and 22 (see FIG. 1). The differential amplifiers 30 are biased by the FIG. 3 reference circuit 32 where I_n is provided by the delay adjust current DAC 12 (see FIG. 1). Comparator 34, shown in FIG. 4, receives the output, out_m and out_p, of the FIG. 2 differential delay chain and converts it to a single ended signal which serves as the clock signal clk_out output by interpolator 10. If the application does not require a single ended clock (as in the case of a phase comparator using a differential flip-flop), then this stage could be omitted.

Figure 5:
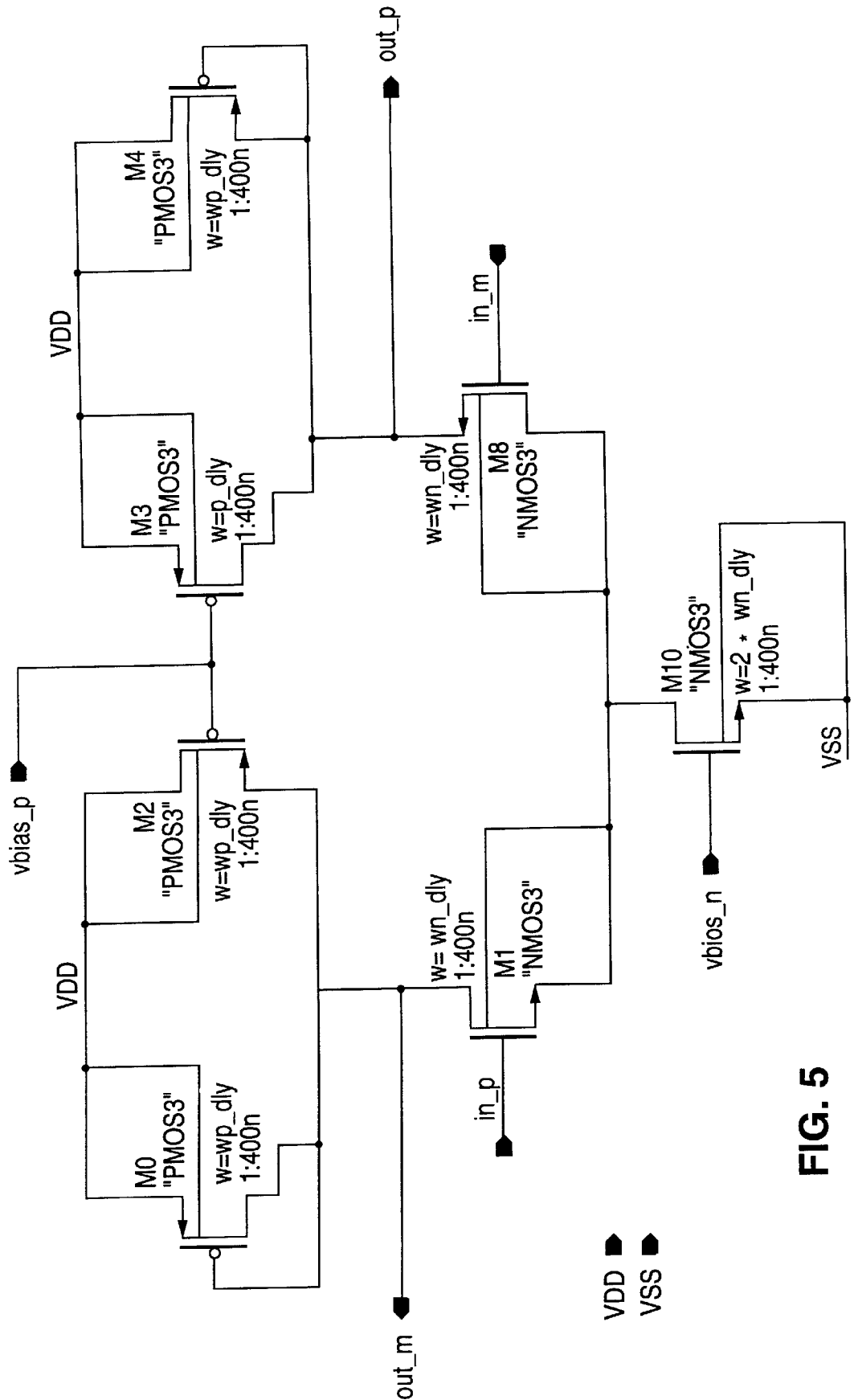
FIG. 5 is a schematic drawing illustrating an embodiment of a variable delay cell utilizable in the delay chain of FIG. 2 delay interpolator.
Figure 6A:
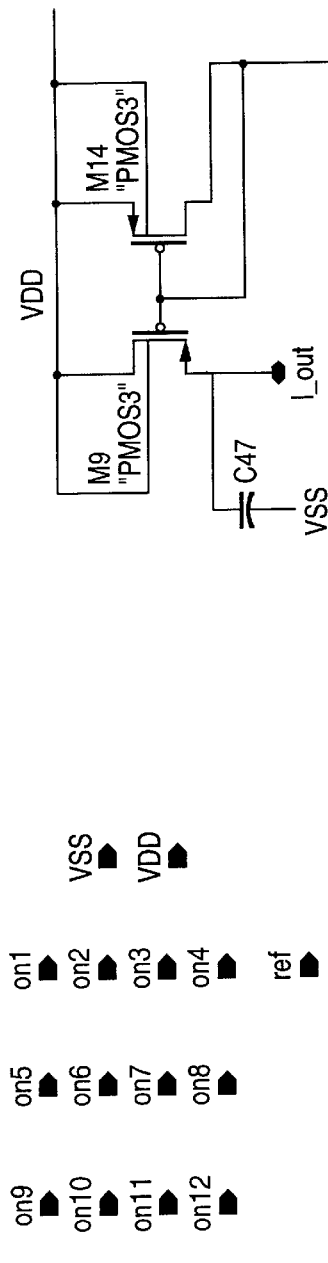
FIG. 6 is a schematic drawing illustrating an embodiment of a delay adjust digital-to-analog convertor utilizable in the FIG. 1 circuit.
Figure 6A:
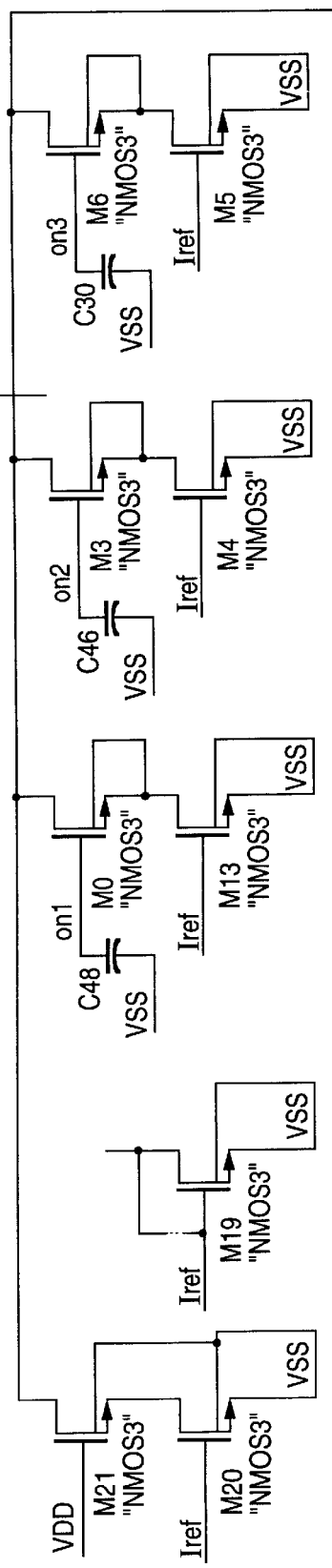
Figure 6A:
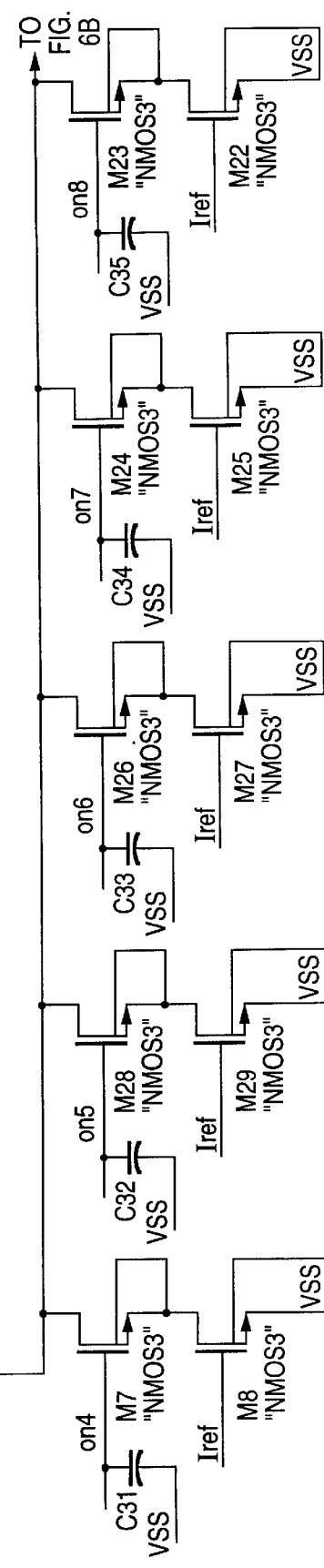
Figure 6B:
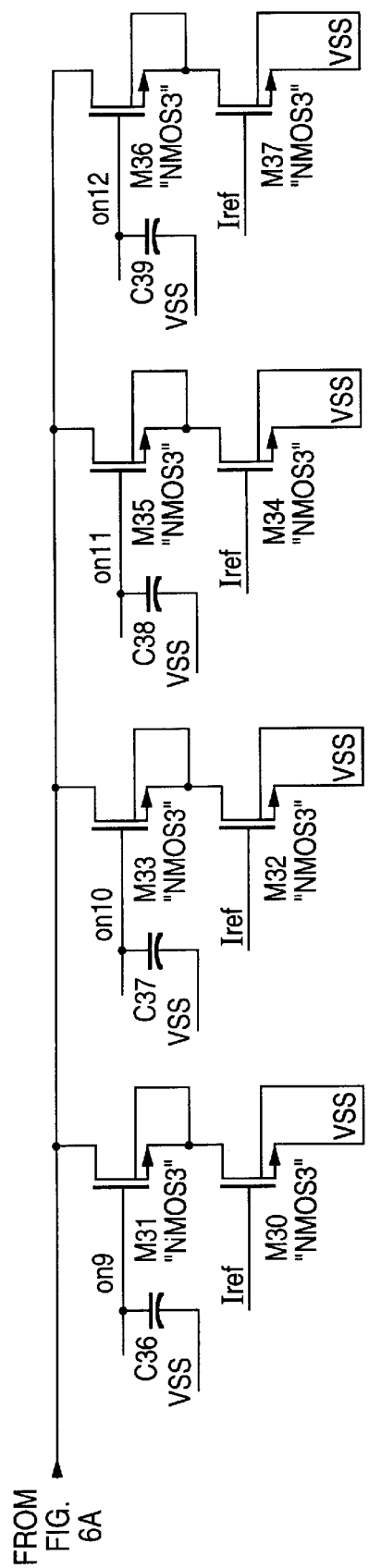

FIG. 5 shows details of an embodiment of one of the open loop differential amplifiers 30 contained in delay chain of delay interpolator 10. When the current I_in from current DAC 12 increases, vbias_p falls, while vbias_n rises. This increases the total available current through transistor M10, where which branch the current flows through depends on the levels of in_m and in_p. With more current available through transistor M10, the switching time decreases and the delay through the variable delay chain decreases. The FIG. 5 circuit is designed to allow a delay range that will span 667 ps over PVT, with some design margin.

FIG. 6 show a detailed embodiment of delay adjust DAC 12 of the FIG. 1 circuit. Note that FIG. 6 shows a twelve bit DAC, while the previous discussion was directed to an eight bit DAC which operates in the same manner. Reference current Iref is provided by the delay interpolator calibrator circuit shown in FIG. 7 and is used to bias the n channel current sources in DAC 12. Each of the n-channel current sources has its drain connected to a common node through n-channel switches, which are turned on or off in response to a control output from delay selector 14. N-channel transistor M20 is always on and provides a portion of the total current flowing into the drain of PMOS transistor M14 that is independent of the state of the twelve current switches. Transistors M9 and M14 mirror this current to provide I_out, which is used to control the current available in the delay chain. This circuit allows adjusting the total available current I_out in twelve steps.

The n-channel current sources are not weighted exactly equally, but in such a way as to cancel the non-linear delay vs. current relationship in the variable delay cell. While this relationship is somewhat linear, since interpolation is to occur over a small delay range (667 ps), it is not perfect and the weighing of these current sources provides a nearly perfectly linear delay vs. current relationship over PVT.

Figure 7:
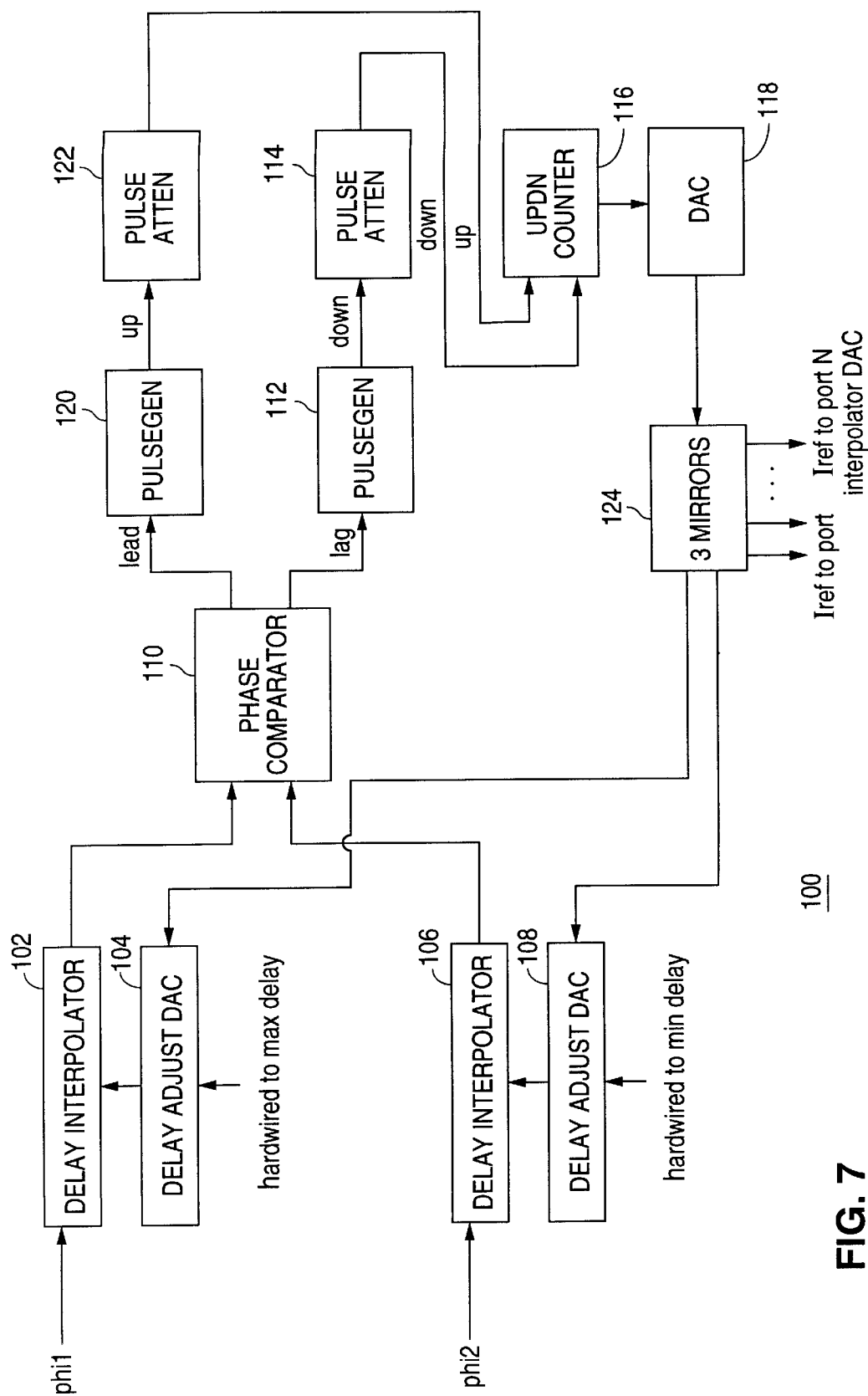
FIG. 7 is a block diagram illustrating a central delay interpolator calibration block utilizable in accordance with the concepts of the present invention.

The central delay interpolator calibration block 100 shown in FIG. 7 is located with the CGM. The purpose of this block is to provide a current reference to the delay adjust DAC 12 located in each receive channel, with the current reference such that each delay increment is exactly 83 ps. With I_ref to the delay adjust DAC 12 constant, at fast PVT each delay increment would be less than at slow PVT. The FIG. 7 calibration circuit 100 adjusts I_ref until the difference in delay between a delay interpolator and delay adjust DAC 12 set to minimum delay and a delay interpolator and delay adjust DAC 12 set to maximum delay is equal to one gross phase step (in this case 667 ps).

As shown in FIG. 7, delay interpolator calibrator 100 includes a delay interpolator stage 102, having CGM phase ph1 signal as its input, and delay adjust DAC 104, having the control input set to all ones (full delay). Calibrator 100 also includes delay interpolator stage 106, having CGM phase phi2 signal as its input, and delay adjust DAC 108 with the control input set to 10000000 (minimum delay). Note that ph1 is advanced 667 ps from phi2. The outputs of delay interpolator stages 102 and 106 are input to phase comparator 110. If the output of interpolator 102 is lagging that of interpolator 106, then the delta delay is too high and a down pulse is generated by pulsegen 112 and sent to digital pulse stream attenuator 114, which masks out every N pulses, with N depending on the desired proportional gain and programmable by a register. These down pulses are used to count down an up/dn counter 116. Up/dn counter 116 is an eight bit updown counter the output of which is used to adjust DAC 118. The up/dn counter's MSB is tied to the switch controlling the largest current source in DAC 118, while the LSB is tied to the smallest. DAC 118 is a binary weighted current DAC which has eight current sources ranging from 1X, 2X, 4X, 8X, . . . 128X. Therefore, a lower count on up/dn counter 116 will result in less current from DAC 118, which in turn will result in a lower I_ref to delay adjust DACs 104 and 108. This in turn results in less delta delay, i.e., smaller delay adjust increments.

If the output of interpolator 102 is leading that of interpolator 106, then the delta delay is too small, and an up pulse is created by pulsegen 120 and sent to digital pulse stream attenuator 122, the output pulses of which cause up/dn counter 116 to count up. When this delay locked loop is in lock, the difference between the delay through the interpolator set to maximum delay 102 and the interpolator set to minimum delay 106 is exactly equal to 667 ps, which is the difference between phi1 and phi2. The interpolator 102 is designed such that there is a linear change in delay in 83 ps increments when the delay selector 14 is adjusted. The current reference output of DAC 118 is mirrored to all other interpolators acting as delay interpolators for the receive clock recovery channels (element 10 of FIG. 1) using current mirrors 124. The accuracy of the slaved delay interpolators (elements 10) is only limited by the degree to which Vt and channel length may be matched for matched devices, which can be very tight (<1%) with proper layout.

For extremely accurate delay interpolation, it may be desirable to implement an architecture having two phase multiplexers per channel, with each channel doing its own calibration using the same interpolators that are doing the interpolation. The second phase multiplexer would always select a phase advanced from the current phase; and the delay selector for this second interpolator would be set such that the delay between the two delay interpolator outputs would always be 667 ps when the I_ref is correctly calibrated. This approach adds power and area, but may be better suited to some applications. It is anticipated that using a central calibration circuit will be sufficient for 100 BT, but a calibrator per channel may be required for 1000 BT.

Physically, the phase multiplexers and phase interpolators are placed very close to a CGM. They take up a very small area (perhaps 10 sq mils for a single phase multiplexer and interpolator on a 0.35 um process), so they can be packed in close to the CGM which allows skew control. The output of the phase interpolator is a non skew critical signal, so the CRM's themselves may be placed very far from the CGM, preferable close to the TP-PMD block at each port. Similarly, the pumpup and pumpdn outputs from the pulse stream combiner are non skew critical.

The inventive approach to increasing phase resolution described above provides several advantages over previous approaches. The interpolator itself operates on only a single phase from the CGM (the output of the channels phase multiplexer), and adjusts the delay linearly between the gross phase steps. This enables only one phase multiplexer per CRM channel. While two clock signal phases are required by the calibrator, only one calibrator is required and can be shared with any number of CRM channels. Also, this type of interpolator is very powerful and area efficient since it only uses a small number of VCO stages (3 in this example), a small phase multiplexer (6:1 in this example) and a single differential delay stage biased by an N (8 in this example) step thermometer code DAC. A CGM with a small number of phases can have the phase resolution enhanced by this interpolator. In contrast, the coupled VCO method described requires multiplying the number of VCO stages by M, where M is the desired enhancement factor for the phase resolution. The method based on using delay-locked-loops requires M+1 DLL's, where M is the desired enhancement factor. The mixer approach requires N/2 mixers for a halving of resolution. Since the interpolation function is done post multiplexing, the skew on the N CGM phases entering the phase multiplexer can be controlled to a finer precision, since there are fewer signals being routed.

For purposes of comparison with the other phase resolution methods discussed above, consider a device with twelve integrated clock recovery channels requiring a phase resolution of 80 ps. The method of the present invention would require the following circuitry: one 6 phase 250 mhz CGM; one DLL calibrator for delay interpolators; twelve 6:1 phase multiplexers; and twelve delay interpolators consisting of a differential delay stage, each biased by an 8 step thermometer code DAC.

For comparison, the coupled ring oscillator approach would require: one 50 phase coupled ring osc VCO and twelve 50:1 phase multiplexers (very hard to match skew with this fan-in to multiplexer).

Although accurate phase error quantization is not required for 100 BT ethernet, the phase interpolator provides a method of phase error quantization for PLL's that do need more accurate quantization. This is typically the case when the DCD portion of the jitter budget is a large fraction of the total jitter budget.

To lock to the center of a bimodal jitter distribution requires being able to quantize the phase error. The resolution of the quantization limits the ability of the loop to accurately lock to the center of a bimodal distribution.

One method of quantizing the phase error is to use a slowly rising edge on the 125 Mhz clock and comparators with levels set such that, as the rising edge reaches that level, a fast edge is triggered. This results in N 125 Mhz clocks, with N being the number of comparators. The delay between the clocks depends on how uniform the slowly rising edge rises and the accuracy of the comparator trip points. Therefore, this solution is not robust over PVT.

Other approaches have used delayed locked loops to create precision delay lines which can be used to sample an input signal and quantize the phase error based on the resolution of the delay line. This approach limits the resolution of the phase compare to the minimum delay possible in the delay line, which is process limited.

In contrast, the present approach uses the phase interpolator described to create eleven precisely spaced delays, where the difference in delays span 1.3 ns, the range of a fixed jitter specified in the TP-PMD spec. This gives a phase quantization resolution of 118 ps, about 4X smaller than that could be achieved with a delay line using the same process. Each delay is on the order of 1 ns, but the delta delay is kept at 118 ps over PVT. The delta delays are calibrated by using the delay interpolator, with the difference being that the inputs to the min and max delay stages are two phases from the CGM separated by two, rather than one phase step. This has the effect of doubling the range of the interpolation.

Clk125 m from the phase multiplexer is the input to each of the eleven equally spaced delays, ranging from delay+0 ns to delay+1.3 ns in 118 ps increments. The center delay becomes RXC, while the five lower delays are increasingly advanced RXC's, and the five upper taps are increasingly retarded RXC's. RXC and the advanced and retarded RXC's are the D input to eleven flops. These are specially designed flops that have equal setup and hold times and, therefore, act as knife edge phase detectors. The clocks of the flops are connected to the incoming data stream. At each rising edge of data, the eleven flops Q's can be used to create a 3 bit lead vector, and 3-bit lag vector, each vector giving the amount of lead or lag error, in 118 ps increments.

The following hdl illustrates this approach:

```
reg [10:0]pc; //11 flops
wire [10:0]rxc_dl://RXC d advanced and delayed in
118ps increments
reg [2:0] lead_err,lag_err;//error vectors
// 11 flops clocked by data, data input is rxc delay
line
always@(posedge data)
    pc<=#1 rxc_dl;
wire [5:0] lower_pc=pc[10:5];
always@(lower_pc)
    casex (lower_pc) //synopsys parallel_case
        6'b111111 : lead_err<=#1 3'b110;
        6'b011111 : lead_err<=#1 3'b101;
        6'b001111 : lead_err<=#1 3'b100
        6'b000111 : lead_err<=#1 3'b011
        6'b000011 : lead_err<=#1 3'b010
        6'b?????1 : lead_err<=#1 3'b001
        default : lead_err<=#1 3'b000
    endcase
wire [5:0] upper_pc=pc[5:0];
always@(upper_pc)
    casex (upper_pc) //synopsys parallel_case
```

-continued

```
        6'b000000 : lag_err<=#1 3'b110;
        6'b000001 : lag_err<=#1 3'b101;
        6'b000011 : lag_err<=#1 3'b100
        6'b000111 : lag_err<=#1 3'b011
        6'b001111 : lag_err<=#1 3'b010
        6'b0????? : lag_err<=#1 3'b001
        default : lag_err<=#1 3'b000
    endcase
```

Data is recovered in the data recovery block, which is the same special flop used in phase comparators (1) and (2). The flop is clocked by the falling edge of RXC, with the D input being RX_P. With the loop in lock, the falling edge of RXC is the optional sampling position.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. A delay interpolation circuit comprising:

a phase interpolator calibrator that takes the adjacent coarse phase signals from a voltage controlled oscillator (VCO) and uses closed loop feedback to create a reference current that is used to bias a thermometer code DAC such that the full range of the distal-to-analog converter (DAC) causes a current controlled delay cell to span a delay equal to the phase difference between the adjacent coarse phase steps in a linear manner;

a delay interpolator that delays a clock signal output received from a phase multiplexer by an integer multiple N of a predefined phase delay, the clock signal output delay being calibrated by the phase interpolator calibrator;

a delay adjuster connected to the delay interpolator for providing the value of N to the delay interpolator;

a delay selector that responds to a phase difference signal corresponding to the phase difference between an incoming data signal and a reference signal by providing corresponding first and second control signals, the first control signal being provided to the delay adjuster for use in determining the value of N; and a coarse phase selector that responds to the second control signal by providing a coarse phase select signal to the phase multiplexer, the coarse phase select signal causing the phase multiplexer to select the clock signal from among a plurality of coarse phase-separated clock signals provided as inputs to the phase multiplexer.

* * * * *